US012658264B2

(12) United States Patent
Mun et al.

(10) Patent No.: US 12,658,264 B2
(45) Date of Patent: Jun. 16, 2026

(54) MEMORY DEVICE PERFORMING ERASE OPERATION AND METHOD OF OPERATING THE SAME

(71) Applicant: SK hynix Inc., Icheon-si Gyeonggi-do (KR)

(72) Inventors: Yeong Jo Mun, Icheon-si Gyeonggi-do (KR); Dong Hun Kwak, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 242 days.

(21) Appl. No.: 18/325,808

(22) Filed: May 30, 2023

(65) Prior Publication Data

US 2024/0185927 A1     Jun. 6, 2024

(30) Foreign Application Priority Data

Dec. 2, 2022    (KR) ........................ 10-2022-0167006

(51) Int. Cl.
| *G11C 16/16* | (2006.01) |
| *G11C 16/28* | (2006.01) |
| *G11C 16/34* | (2006.01) |

(52) U.S. Cl.
CPC .............. *G11C 16/16* (2013.01); *G11C 16/28* (2013.01); *G11C 16/3445* (2013.01)

(58) Field of Classification Search
CPC ...... G11C 16/16; G11C 16/28; G11C 16/3445
USPC ................................................. 365/185.29
See application file for complete search history.

(56) References Cited

U.S. PATENT DOCUMENTS

| 9,449,698 | B1 * | 9/2016 | Paudel | G11C 16/3445 |
| 9,583,201 | B1 * | 2/2017 | Lee | G11C 16/10 |
| 9,711,229 | B1 * | 7/2017 | Rabkin | H10B 43/10 |
| 2014/0133232 | A1 * | 5/2014 | Avila | G11C 16/26 |
| | | | | 365/185.11 |
| 2015/0117129 | A1 * | 4/2015 | Jung | G11C 16/107 |
| | | | | 365/218 |
| 2015/0143068 | A1 | 5/2015 | Higgins et al. | |
| 2016/0099061 | A1 * | 4/2016 | Ziperovich | G11C 16/16 |
| | | | | 365/185.11 |
| 2017/0344295 | A1 * | 11/2017 | Sheffi | G06F 21/79 |

(Continued)

FOREIGN PATENT DOCUMENTS

| KR | 1020100013187 A | 2/2010 |
| KR | 1020180032426 A | 3/2018 |

(Continued)

*Primary Examiner* — Alexander Sofocleous
*Assistant Examiner* — Duy H Luong
(74) *Attorney, Agent, or Firm* — WILLIAM PARK AND ASSOCIATES LTD.

(57) ABSTRACT

A memory device, and a method of operating the memory device, includes a memory block, a peripheral circuit, an erase controller, and a parameter setter. The memory device includes a plurality of sub blocks. The peripheral circuit performs an erase operation on a target sub block among the plurality of sub blocks. The erase controller controls the peripheral circuit to perform the erase operation based on a default parameter or an optimal parameter according to a group to which the target sub block belongs among first, second, and third groups. The parameter setter sets the optimal parameter based on a result of the erase operation when the target sub block is included in the first group or the third group.

20 Claims, 6 Drawing Sheets

(56) References Cited

U.S. PATENT DOCUMENTS

| | | | | |
|---|---|---|---|---|
| 2020/0402590 | A1* | 12/2020 | Park | G11C 16/24 |
| 2021/0011633 | A1* | 1/2021 | Kim | G11C 16/0483 |
| 2021/0327513 | A1* | 10/2021 | Hwang | G11C 16/14 |
| 2022/0101926 | A1* | 3/2022 | Oowada | G11C 16/16 |
| 2022/0199164 | A1* | 6/2022 | Kim | G11C 16/0433 |
| 2024/0071527 | A1* | 2/2024 | Che | G11C 11/5628 |

FOREIGN PATENT DOCUMENTS

| | | |
|---|---|---|
| KR | 1020180058890 A | 6/2018 |
| KR | 1020190076228 A | 7/2019 |

* cited by examiner

| Sub BLK | Erase Operation Sequence | Group Status |
|---------|--------------------------|--------------|
| S3 | 3 | Group 2 (F) |
| S2 | 1 | Group 1 (L) |
| S1 | 2 | Group 3 (L&F) |

| Group Classification | |
|----------------------|----------------------|
| Leading Group (L) | Following Group (F) |
| Sub BLK to be erased when BLK includes at least two programmed sub BLKs | Sub BLK to be erased when BLK includes at least one erased sub BLKs |

MEMORY DEVICE PERFORMING ERASE OPERATION AND METHOD OF OPERATING THE SAME

CROSS-REFERENCE TO RELATED APPLICATION

The present application claims priority under 35 U.S.C. § 119(a) to Korean patent application number 10-2022-0167006 filed on Dec. 2, 2022, in the Korean Intellectual Property Office, the entire disclosure of which is incorporated by reference herein.

BACKGROUND

1. Technical Field

The present disclosure relates to an electronic device, and more particularly, to a memory device and a method of operating the same performing an erase operation on another sub block using an optimal parameter set based on a result of an erase operation on a sub block included in a memory block.

2. Related Art

A storage device is a device that stores data under the control of a host device such as a computer or a smartphone. The storage device may include a memory device in which data is stored and a memory controller to control the memory device. The memory device is classified as a volatile memory device or a nonvolatile memory device.

The storage device may include a plurality of memory blocks, and each memory block may include a plurality of sub blocks. Erase performance may be improved by performing an erase operation on another sub block included in the same memory block using an optimal parameter set based on a result of an erase operation on a sub block included in the memory block.

SUMMARY

An embodiment of the present disclosure provides a memory device and a method of operating the same having improved erase performance using an optimal parameter set based on a result of an erase operation of sub blocks included in a memory block.

According to an embodiment of the present disclosure, a memory device may include a memory block, a peripheral circuit, an erase controller, and a parameter setter. The memory device may include a plurality of sub blocks. The peripheral circuit may perform an erase operation on a target sub block among the plurality of sub blocks. The erase controller may control the peripheral circuit to perform the erase operation based on a default parameter or an optimal parameter according to a group to which the target sub block belongs among first, second, and third groups. The parameter setter may set the optimal parameter based on a result of the erase operation when the target sub block is included in the first group or the third group.

According to the present disclosure, a method of operating a memory device may include determining a group to which a target sub block on which an erase operation is to be performed belongs among a plurality of sub blocks included in a memory block, performing the erase operation based on a default parameter or an optimal parameter according to a group to which the target sub block belongs among first, second, and third groups, and setting the optimal parameter based on a result of the erase operation when the target sub block is included in the first group or the third group.

According to the present technology, a memory device and a method of operating the same having improved erase performance using an optimal parameter set based on a result of an erase operation of sub blocks included in a memory block are provided.

DETAILED DESCRIPTION

Specific structural or functional descriptions of embodiments which are disclosed in the present specification or application are illustrated to describe the embodiments according to the concept of the present disclosure. The embodiments according to the concept of the present disclosure may be carried out in various forms and should not be construed as being limited to the embodiments described in the present specification or application.

Figure 1:
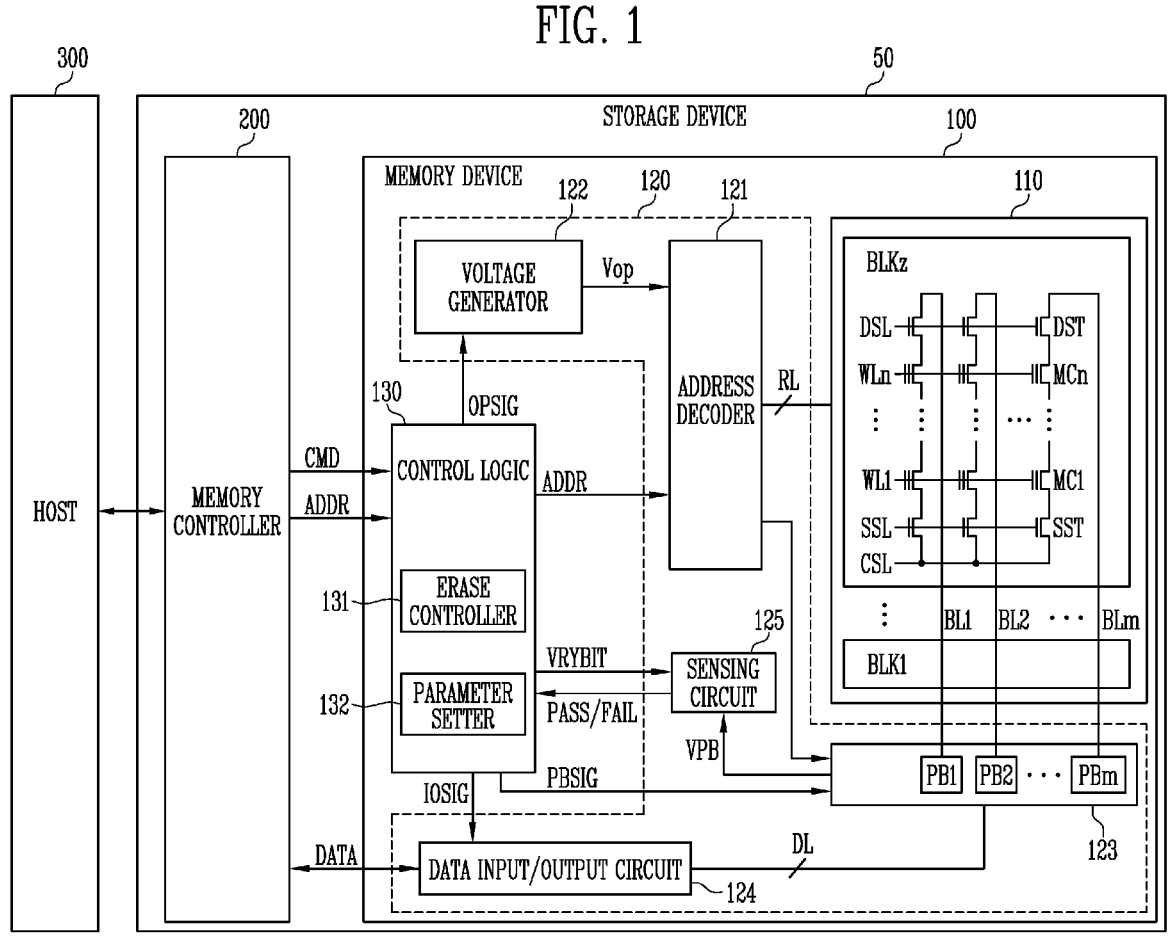
FIG. 1 is a diagram illustrating a storage device according to an embodiment of the present disclosure.

FIG. 1 is a diagram illustrating a storage device according to an embodiment of the present disclosure.

Referring to FIG. 1, the storage device 50 may include a memory device 100 and a memory controller 200. The storage device 50 may be a device that stores data under the control of a host 300, such as a mobile phone or a computer. The storage device 50 may be manufactured as various types of storage devices such as a solid-state drive (SSD) and a universal flash storage (UFS) according to a host interface, which is a communication method with the host 300. The storage device 50 may be manufactured as various types of package forms such as a system on chip (SOC).

The memory device 100 may store data. The memory device 100 may operate under the control of the memory controller 200. In an embodiment, the memory device 100 may be a nonvolatile memory device or a volatile memory device.

The memory device 100 may be configured to receive a command CMD and an address ADDR from the memory controller 200 and access an area of the memory cell array 110 selected by the address ADDR. The memory device 100 may perform an operation instructed by the command CMD on the area selected by the address ADDR. For example, the memory device 100 may perform a write operation (program operation), a read operation, and an erase operation. The memory device 100 may program, read, or erase data in the area selected by the address ADDR.

In an embodiment, the memory device 100 may perform the erase operation on a target sub block among a plurality of sub blocks included in a memory block. The erase operation on the target sub block may be a partial erase operation.

The memory device 100 may classify the target sub block according to which group among first to third groups the target sub block is included in. For example, the memory device 100 may determine that the target sub block belongs to the first group when the memory block includes a first reference number or more of programmed sub blocks during the erase operation. The memory device 100 may determine that the target sub block belongs to the second group when the memory block includes a second reference number or more of erased sub blocks during the erase operation. The memory device 100 may determine that the target sub block belongs to the third group when the memory block includes the first reference number or more of programmed sub blocks and the second reference number or more of erased sub blocks. In an embodiment, the first reference number may be two (2) and the second reference number may be one (1).

The memory device 100 may control a peripheral circuit 120 to perform the erase operation based on a default parameter or an optimal parameter according to a group to which the target sub block belongs. The default parameter may include erase parameter values preset in a manufacturing process step. The optimal parameter may include erase parameter values optimized in a user use step.

When the target sub block is included in the first group, the memory device 100 may control the peripheral circuit 120 to perform the erase operation on the target sub block based on the default parameter.

In an embodiment, when the target sub block is included in the second group or the third group, the memory device 100 may control the peripheral circuit 120 to perform the erase operation on the target sub block based on the optimal parameter. For example, the memory device 100 may control the peripheral circuit 120 to perform the erase operation on the target sub block based on an optimal parameter to which a weight according to a position of the target sub block is applied. The memory device 100 may control the peripheral circuit 120 to perform the erase operation on the target sub block based on an optimal parameter to which a weight according to a diameter of a channel where the target sub block is positioned is applied.

When the target sub block is included in the first group or the third group, the memory device 100 may set the optimal parameter or update a previous optimal parameter based on a result of the erase operation. The result of the erase operation may include erase parameter values measured in the erase operation.

In an embodiment, the memory device 100 may include a memory cell array 110, the peripheral circuit 120, and control logic 130.

The memory cell array 110 may include a plurality of memory blocks BLK1 to BLKz. The plurality of memory blocks BLK1 to BLKz may be connected to an address decoder 121 through row lines RL. The plurality of memory blocks BLK1 to BLKz may be connected to a read and write circuit 123 through bit lines BL1 to BLm. Each of the plurality of memory blocks BLK1 to BLKz may include a plurality of memory cells. In an embodiment, the plurality of memory cells may be nonvolatile memory cells.

In an embodiment, any one memory block BLKz among the plurality of memory blocks BLK1 to BLKz may include a plurality of word lines WL1 to WLn arranged parallel to each other between a drain select line DSL and a source select line SSL. The memory block BLKz may include a plurality of memory cell strings connected between any one bit line and a common source line CSL. The bit lines BL1 to BLm may be connected to the plurality of memory cell strings, respectively, and the common source line CSL may be commonly connected to the plurality of memory cell strings.

For example, the memory cell string may include a drain select transistor DST, a plurality of memory cells MC1 to MCn, and a source select transistor SST connected in series between the common source line CSL and a first bit line BL1. One memory cell string may include at least one drain select transistor DST and at least one source select transistor SST.

A drain of the drain select transistor DST may be connected to the first bit line BL1 and a source of the source select transistor SST may be connected to the common source line CSL. The plurality of memory cells MC1 to MCn may be connected in series between the drain select transistor DST and the source select transistor SST. Gates of the source select transistors SST included in different memory cell strings may be connected to the source select line SSL. Gates of the drain select transistors DST may be connected to the drain select line DSL. Gates of the plurality of memory cells MC1 to MCn may be connected to the plurality of word lines WL1 to WLn. Among memory cells included in different memory cell strings, memory cells connected to the same word line may be defined as a physical page PG. The memory block BLKz may include physical pages of the number corresponding to the number of the plurality of word lines WL1 to WLn.

The memory cells MC1 to MCn may be configured as a single-level cell (SLC) that stores one bit of data, a multi-level cell (MLC) that stores two bits of data, a triple-level cell (TLC) that stores three bits of data, a quad-level cell (QLC) capable of storing four bits of data, or memory cells capable of storing five or more bits of data.

One physical page may store as many logical page data as the number of bits of data that each of the memory cells may store. For example, when memory cells are configured as TLCs, one physical page may store three logical page data.

The peripheral circuit 120 may drive the memory cell array 110. For example, the peripheral circuit 120 may drive the memory cell array 110 to perform the program operation, the read operation, and the erase operation. As another example, the peripheral circuit 120 may apply various operations voltages to the row lines RL and the bit lines BL1 to BLm or discharge the applied voltages according to control of the control logic 130.

The peripheral circuit 120 may include the address decoder 121, a voltage generator 122, the read and write circuit 123, a data input/output circuit 124, and a sensing circuit 125.

The address decoder 121 may be connected to the memory cell array 110 through the row lines RL. The row lines RL may include the drain select lines DSL, the plurality of word lines WL1 to WLn, the source select lines SSL, and the common source line CSL.

The address decoder 121 may be configured to operate in response to the control of the control logic 130. The address decoder 121 may receive the address ADDR from control logic 130.

The address decoder 121 may be configured to decode a block address of the received address ADDR. The address decoder 121 may select at least one memory block among the memory blocks BLK1 to BLKz according to the decoded block address. The address decoder 121 may be configured to decode a row address of the received address ADDR. The address decoder 121 may select at least one word line of the selected memory block by applying voltages provided from the voltage generator 122 to at least one word line WL according to the decoded row address.

The erase operation of the memory device 100 is performed in a memory block unit. The address ADDR input to the memory device 100 during the erase operation includes a block address. The address decoder 121 may decode the block address and select one memory block according to the decoded block address. During the erase operation, the address decoder 121 may apply a ground voltage to word lines input to the selected memory block.

The address decoder 121 may be configured to decode a column address of the transferred address ADDR. The decoded column address may be transferred to the read and write circuit 123. For example, the address decoder 121 may include components such as a row decoder, a column decoder, and an address buffer.

The voltage generator 122 may be configured to generate a plurality of operation voltages Vop by using an external power voltage supplied to the memory device 100. The voltage generator 122 may operate in response to the control of the control logic 130.

In an embodiment, the voltage generator 122 may generate an internal power voltage by regulating the external power voltage. The internal power voltage generated by the voltage generator 122 may be used as an operation voltage of the memory device 100.

In an embodiment, the voltage generator 122 may generate the various operation voltages Vop used for the program, read, and erase operations in response to an operation signal OPSIG. The voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

The voltage generator 122 may include a plurality of pumping capacitors receiving the internal power voltage to generate the plurality of operation voltages Vop having various voltage levels. The voltage generator 122 may generate the plurality of operation voltages Vop by selectively activating the plurality of pumping capacitors in response to the control of the control logic 130.

The plurality of generated operation voltages Vop may be supplied to the memory cell array 110 by the address decoder 121.

The read and write circuit 123 may include first to m-th page buffers PB1 to PBm. The first to m-th page buffers PB1 to PBm may be connected to the memory cell array 110 through first to m-th bit lines BL1 to BLm, respectively. The first to m-th page buffers PB1 to PBm may operate in response to the control of the control logic 130.

The first to m-th page buffers PB1 to PBm may communicate data DATA with the data input/output circuit 124. During programming, the first to m-th page buffers PB1 to PBm may receive the data DATA to be stored through the data input/output circuit 124 and data lines DL.

The data input/output circuit 124 may be connected to the first to m-th page buffers PB1 to PBm through the data lines DL. The data input/output circuit 124 may operate in response to the control of the control logic 130.

The data input/output circuit 124 may include a plurality of input/output buffers (not shown) that receive the input data DATA. During the program operation, the data input/output circuit 124 may receive the data DATA to be stored from the memory controller 200. During the read operation, the data input/output circuit 124 may output the data DATA transferred from the first to m-th page buffers PB1 to PBm included in the read and write circuit 123 to the memory controller 200. During the read operation or a program verify operation, the sensing circuit 125 may generate a reference current in response to a signal of an allowable bit VRYBIT generated by the control logic 130 and may compare a sensing voltage VPB received from the read and write circuit 123 with a reference voltage generated by the reference current to output a pass signal or a fail signal to the control logic 130. For example, the sensing circuit 125 may output the pass signal to the control logic 130 when a magnitude of the sensing voltage VPB is less than the reference voltage. As another example, the sensing circuit 125 may output the fail signal to the control logic 130 when the magnitude of the sensing voltage VPB is greater than the reference voltage.

The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to the command CMD transferred from the memory controller 200. The control logic 130 may be implemented as hardware, software, or a combination of hardware and software. For example, the control logic 130 may be a control logic circuit operating in accordance with an algorithm and/or a processor executing control logic code.

The control logic 130 may control the peripheral circuit 120 by generating various signals in response to the command CMD and the address ADDR. For example, the control logic 130 may generate the operation signal OPSIG, the address ADDR, a page buffer control signal PBSIG, an input and output control signal IOSIG, and the allowable bit VRYBIT in response to the command CMD and the address ADDR. The control logic 130 may output the operation signal OPSIG to the voltage generator 122, output the address ADDR to the address decoder 121, output the page buffer control signal to the read and write circuit 123, output the input and output control signal IOSIG to the data input/output circuit 124, and output the allowable bit VRYBIT to the sensing circuit 125. In addition, the control logic 130 may determine whether a verify operation is passed or failed in response to the pass or fail signal PASS/FAIL output from the sensing circuit 125.

In an embodiment, the control logic 130 may include an erase controller 131 and a parameter setter 132.

In an embodiment, the peripheral circuit 120 may perform the erase operation on the target sub block among the plurality of sub blocks included in the memory block. The erase operation on the target sub block may be the partial erase operation.

The erase controller 131 may classify to which group among the first to third groups the target sub block belongs to. For example, the erase controller 131 may classify the target sub block into the first group when the memory block includes the first reference number or more of programmed sub blocks during the erase operation. The erase controller 131 may classify the target sub block into the second group when the memory block includes the second reference number or more of erased sub blocks during the erase operation. The erase controller 131 may classify the target sub block into the third group when the memory block includes the first reference number or more of programmed sub blocks and the second reference number or more of erased sub blocks during the erase operation. In an embodiment, the first reference number may be two (2) and the second reference number may be one (1).

The erase controller 131 may control the peripheral circuit 120 to perform the erase operation based on the default parameter or the optimal parameter according to the group to which the target sub block belongs. The default parameter may include the erase parameter values preset in the manufacturing process step. The optimal parameter may include the erase parameter values optimized in the user use step. The erase parameter values may include at least one of the erase pulse count, the erase voltage level, the verify pulse count, and the verify voltage level. A type and an example of the erase parameter values are not limited to the present embodiment.

When the target sub block is included in the first group, the erase controller 131 may control the peripheral circuit 120 to perform the erase operation on the target sub block based on the default parameter.

In an embodiment, when the target sub block is included in the second group or the third group, the erase controller 131 may control the peripheral circuit 120 to perform the erase operation on the target sub block based on the optimal parameter.

In another embodiment, the erase controller 131 may control the peripheral circuit 120 to perform the erase operation in consideration of the weight according to the position of the target sub block. The erase controller 131 may control the peripheral circuit 120 to perform the erase operation on the target sub block based on the optimal parameter to which the weight according to the position of the target sub block is applied.

When the position of the target sub block is a reference position of the memory block, the erase controller 131 may control the peripheral circuit 120 to perform the erase operation based on the optimal parameter to which a basic weight is applied. The reference position may be a middle part. The basic weight may be one (1). The reference position and the basic weight are not limited to the present embodiment. For example, the erase controller 131 may perform the erase operation on the target sub block positioned in the middle part of the memory block based on a value obtained by multiplying the optimal parameter by the basic weight.

When the position of the target sub block is lower than the reference position, the erase controller 131 may control the peripheral circuit 120 to perform the erase operation based on the optimal parameter to which a weight lower than the basic weight is applied. When the position of the target sub block is higher than the reference position, the erase controller 131 may control the peripheral circuit 120 to perform the erase operation based on the optimal parameter to which a weight higher than the basic weight is applied.

When the diameter of the channel where the target sub block is positioned is a reference size, the erase controller 131 may control the peripheral circuit 120 to perform the erase operation on the target sub block based on the optimal parameter to which the basic weight is applied. The reference size may be a median size of the diameter of the channel. The reference size is not limited to the present embodiment. When the diameter of the channel where the target sub block is positioned is less than the reference size, the erase controller 131 may control the peripheral circuit 120 to perform the erase operation on the target sub block based on the optimal parameter to which the weight lower than the basic weight is applied. When the diameter of the channel where the target sub block is positioned is greater than the reference size, the erase controller 131 may control the peripheral circuit 120 to perform the erase operation based on the optimal parameter to which the weight higher than the basic weight is applied.

When the target sub block is included in the first group or the third group, the parameter setter 132 may set the optimal parameter or update the previous optimal parameter based on the result of the erase operation. The result of the erase operation may include the erase parameter values measured in the erase operation.

The memory controller 200 may control an overall operation of the storage device 50.

The memory controller 200 may control the memory device 100 to perform the write operation, the read operation, the erase operation, or the like according to a request of the host 300. The memory controller 200 may provide the command, a physical block address, or the data to the memory device 100 according to the write operation, the read operation, or the erase operation.

In an embodiment, the memory controller 200 may generate the command, the address, and the data and transmit the command, the address, and the data to the memory device 100 independently regardless of the request from the host 300. For example, the memory controller 200 may provide the command CMD, the address ADDR, and the data DATA for performing the read operation and the write operations involved in performing wear leveling, read reclaim, garbage collection, and the like, to the memory device 100.

The host 300 may communicate with the storage device 50 using various communication methods such as a dual in-line memory module (DIMM).

Figure 2:
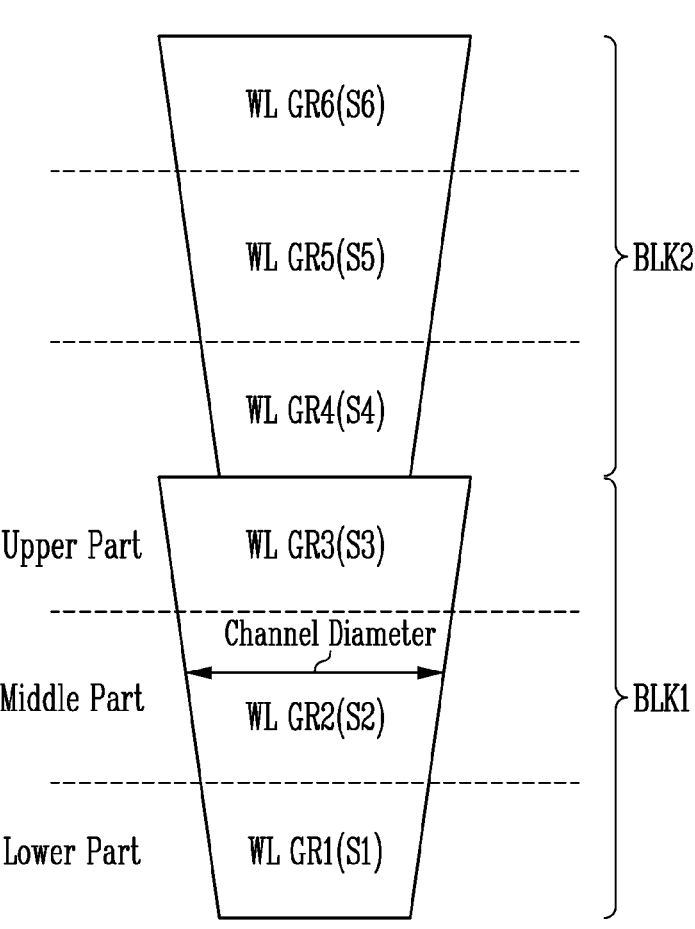
FIG. 2 is a diagram illustrating a structure of a memory block including a plurality of sub blocks.

FIG. 2 is a diagram illustrating a structure of the memory block including the plurality of sub blocks.

Referring to FIG. 2, a memory array may include memory blocks stacked in a 3D structure.

In FIG. 2, a second memory block BLK2 may be stacked on a first memory block BLK1. The first memory block BLK1 may include first to third word line groups WL GR1 to WL GR3. The second memory block BLK2 may include fourth to sixth word line groups WL GR4 to WL GR6.

Memory cells connected to each word line group may form a sub block. The first to third word line groups WL GR1 to WL GR3 may correspond to first to third sub blocks S1 to S3, respectively. A position of the first sub block S1 may be at a lower part of the first memory block BLK1. A position of the second sub block S2 may be a middle part of the first memory block BLK1. A position of the third sub block S3 may be an upper part of the first memory block BLK1.

The stacked memory blocks may have a trapezoidal shape, and a diameter of a channel may increase from a lower part to an upper part. As the diameter of the channel increases, the memory cell may be less affected by a parameter value during the erase operation. Conversely, as the diameter of the channel decreases, the memory cell may be more affected by the parameter value during the erase operation.

Therefore, for the same erase performance, the erase operation may be performed based on the erase parameter to which different weights are applied according to the position of the sub block in the memory block. For example, when the position of the second sub block S2 is a reference position of the first memory block BLK1, the erase operation on the second sub block S2 may be performed based on the erase parameter to which a basic weight is applied. The basic weight may be taken as one (1). At this time, because the position of the first sub block S1 is lower than the reference position, the erase operation on the first sub block S1 may be performed based on the erase parameter to which a weight less than the basic weight is applied. Because the position of the third sub block S3 is higher than the reference position, the erase operation on the third sub block S3 may be performed based on the erase parameter to which a weight greater than the basic weight is applied.

In an embodiment, for the same erase performance, the erase operation may be performed based on the erase parameter to which different weights are applied according to the diameter of the channel where the sub block is positioned in the memory block. For example, when a diameter of a channel where the second sub block S2 is positioned is a reference size of the first memory block BLK1, the erase operation on the second sub block S2 may be performed based on the erase parameter to which the basic weight is applied. The basic weight may be one (1). At this time, because a diameter of a channel where the first sub block S1 is positioned is less than the reference size, the erase operation on the first sub block S1 may be performed based on the erase parameter to which the weight less than the basic weight is applied. Because a diameter of a channel where the third sub block S3 is positioned is greater than the reference size, the erase operation on the third sub block S3 may be performed based on the erase parameter to which the weight greater than the basic weight is applied.

Figure 3:
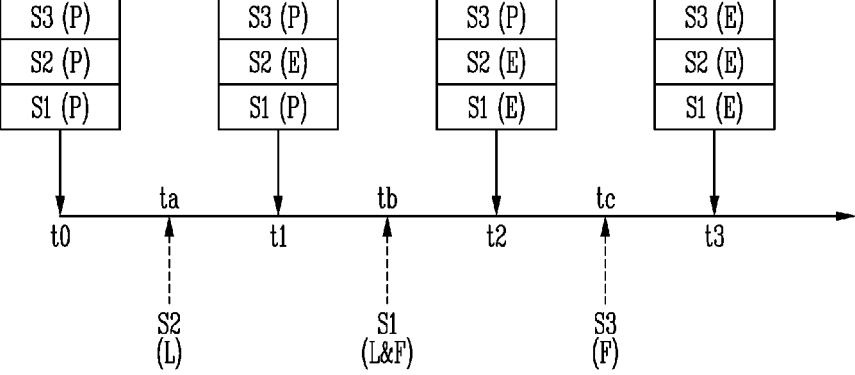
FIG. 3 is a diagram illustrating a method of classifying a group to which a target sub block on which an erase operation is to be performed belongs.

FIG. 3 is a diagram illustrating a method of classifying the group to which the target sub block on which the erase operation is to be performed belongs.

Referring to FIG. 3, among the sub blocks included in the memory block, the target sub block on which the erase operation is to be performed may be classified as belonging to any one group among the first to third groups.

For example, the target sub block may be included in a leading group when the memory block includes at least two programmed sub blocks at a time of the erase operation. The target sub block may be included in a following group when the memory block includes at least one erased sub block at the time of the erase operation. A result of the erase operation on the target sub block included in the leading group may be used to set the optimal parameter. The erase operation on the target sub block included in the following group may be performed based on a previously set optimal parameter.

The target sub block belonging only to the leading group may be classified into the first group. The target sub block belonging only to the following group may be classified into the second group. The target sub block included in both of the leading group and the following group may be classified into the third group.

In FIG. 3, the erase operation may be performed on the sub blocks included in the memory block in an order of the second sub block S2, the first sub block S1, and the third sub block S3.

At time to, all of the first to third sub blocks S1 to S3 may be in a programmed state.

At time ta, the erase operation may be performed on the second sub block S2. During the erase operation on the second sub block S2, because the memory block includes three programmed sub blocks, the second sub block S2 may belong only to the leading group and may be classified into the first group.

At time t1, the first and third sub blocks S1 and S3 may be in a programmed state. The second sub block S2 may be in an erased state.

At time tb, the erase operation may be performed on the first sub block S1. During the erase operation on the first sub block S1, because the memory block includes two programmed sub blocks and one erased sub block, the first sub block S1 may be included in both of the leading group and the following group and may be classified into the third group.

At time t2, the third sub block S3 may be in a programmed state. The first and second sub blocks S1 and S2 may be in an erased state.

At time tc, the erase operation may be performed on the third sub block S3. During the erase operation on the third sub block S3, because the memory block includes one programmed sub block and two erased sub blocks, the third sub block S3 may belong only to the following group and may be classified into the second group. This leaves the first, second, and third sub blocks in an erased state at time t3.

Figure 4:
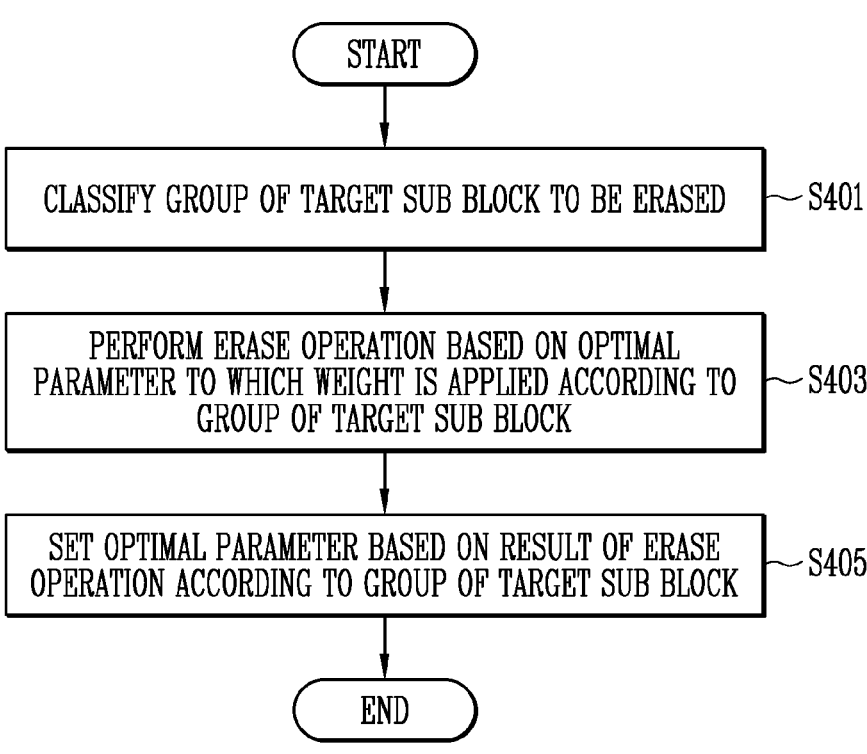
FIG. 4 is a flowchart illustrating operation of a memory device according to an embodiment.

FIG. 4 is a flowchart illustrating an operation of a memory device according to an embodiment.

Referring to FIG. 4, in step S401, the memory device may classify a target sub block to be erased among the plurality of sub blocks included in the memory block into any one group among the first to third groups. For example, the memory device may determine that the target sub block belongs to the first group when the memory block includes the first reference number or more of programmed sub blocks during the erase operation on the target sub block. The memory device may determine that the target sub block belongs to the second group when the memory block includes the second reference number or more of erased sub blocks during the erase operation. The memory device may determine that the target sub block belongs to the third group when the memory block includes the first reference number or more of programmed sub blocks and the second reference number or more of erased sub blocks. In an embodiment, the first reference number may be 2 and the second reference number may be 1.

In step S403, the memory device may perform the erase operation based on the optimal parameter to which the weight is applied according to the group to which the target sub block belongs. For example, the memory device may perform the erase operation based on the optimal parameter when the target sub block is included in the second group or the third group. The memory device may perform the erase operation based on the default parameter when the target sub block is included in the first group.

In step S405, the memory device may set the optimal parameter based on the result of the erase operation according to the group to which the target sub block belongs. For example, when the target sub block is included in the first group or the third group, the memory device may set the optimal parameter based on the result of the erase operation. Setting of the optimal parameter may also include update of the optimal parameter.

Figure 5:
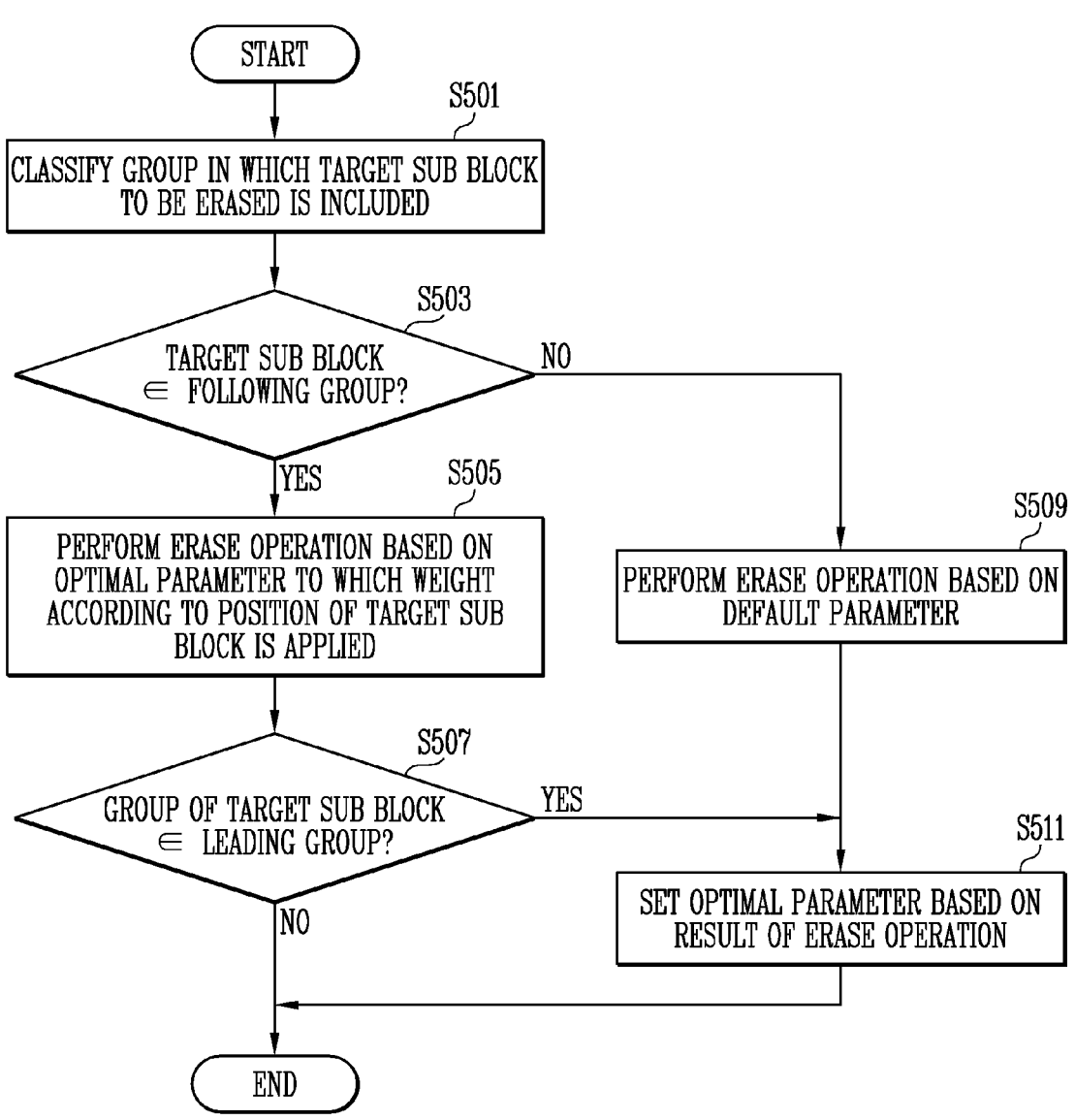
FIG. 5 is a flowchart illustrating operation of a memory device according to an embodiment.

FIG. 5 is a flowchart illustrating an operation of a memory device according to an embodiment.

Referring to FIG. 5, in step S501, the memory device may classify the group including the target sub block to be erased among the plurality of sub blocks included in the memory block. The memory device may classify whether the target sub block is included in each of the leading group and the following group.

For example, the target sub block may be included in the leading group when the memory block includes at least two programmed sub blocks at the time of the erase operation. The target sub block may be included in the following group when the memory block includes at least one erased sub block at the time of the erase operation. The target sub block may be included in both of the leading group and the following group when the memory block includes at least two programmed sub blocks and at least one erased sub block at the time of the erase operation.

In step S503, the memory device may determine whether the target sub block is included in the following group. As a result of the determination, when the target sub block is included in the following group, the operation proceeds to step S505, and when the target sub block is not included in the following group, the operation proceeds to step S509.

In step S505, the memory device may perform the erase operation on the target sub block based on the optimal parameter to which the weight according to the position of the target sub block is applied.

In step S507, the memory device may determine whether the target sub block is included in the leading group. As a result of the determination, when the target sub block is included in the leading group, the operation proceeds to step S511, and when the target sub block is not included in the leading group, the operation is ended.

In step S509, the memory device may perform the erase operation on the target sub block on the default parameter.

In step S511, the memory device may set the optimal parameter based on the result of the erase operation on the target sub block. Setting of the optimal parameter may include update of the optimal parameter.

Figure 6:
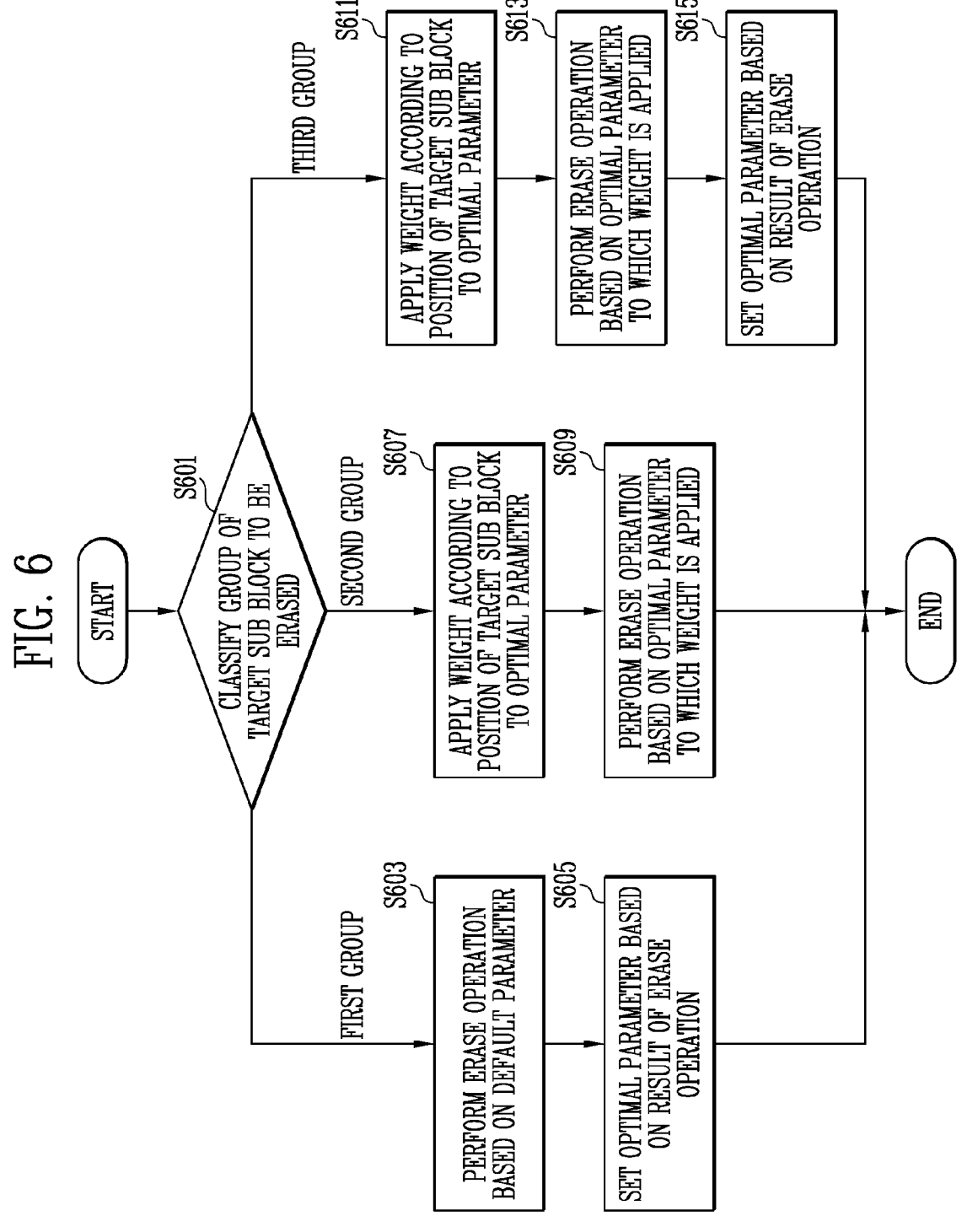
FIG. 6 is a flowchart illustrating operation of a memory device according to an embodiment.

FIG. 6 is a flowchart illustrating an operation of a memory device according to an embodiment.

Referring to FIG. 6, in step S601, the memory device may classify the target sub block to be erased among the plurality of sub blocks included in the memory block into any one group among first to third groups. When the target sub block is determined to be in the first group, the operation may proceed to step S603, when the target sub block is determined to be in the second group, the operation may proceed to step S607, and when the target sub block is determined to be in the third group, the operation may proceed to step S611.

In step S603, the memory device may perform the erase operation on the target sub block based on the default parameter.

In step S605, the memory device may set the optimal parameter based on the result of the erase operation on the target sub block.

In step S607, the memory device may apply the weight according to the position of the target sub block to an optimization parameter.

In step S609, the memory device may perform the erase operation on the target sub block based on the optimal parameter to which the weight is applied.

In step S611, the memory device may apply the weight according to the position of the target sub block to the optimization parameter.

In step S613, the memory device may perform the erase operation on the target sub block based on the optimal parameter to which the weight is applied.

In step S615, the memory device may set the optimal parameter based on the result of the erase operation on the target sub block.

What is claimed is:

1. A memory device comprising:
a memory block including a plurality of sub blocks;

a peripheral circuit configured to perform an erase operation on a target sub block among the plurality of sub blocks;
an erase controller configured to control the peripheral circuit to perform the erase operation based on a default parameter or an optimal parameter according to a group to which the target sub block belongs among first, second, and third groups;
wherein the group to which the target sub block belongs is determined based on a number of programmed sub blocks or a number of erase sub blocks included in the memory block; and
a parameter setter configured to set the optimal parameter based on a result of the erase operation when the target sub block is included in the first group or the third group.

2. The memory device of claim 1, wherein:
the target sub block is included in the first group when the memory block includes a first reference number or more of programmed sub blocks during the erase operation;
the target sub block is included in the second group when the memory block includes a second reference number or more of erased sub blocks; and
the target sub block is included in the third group when the memory block includes the first reference number or more of programmed sub blocks and the second reference number or more of erased sub blocks.

3. The memory device of claim 2,
wherein the erase controller controls the peripheral circuit to perform the erase operation based on the default parameter when the target sub block is included in the first group.

4. The memory device of claim 2,
wherein the erase controller controls the peripheral circuit to perform the erase operation based on the optimal parameter when the target sub block is included in the second group or the third group.

5. The memory device of claim 4,
wherein the erase controller controls the peripheral circuit to perform the erase operation based on the optimal parameter to which a weight according to a position of the target sub block in the memory block is applied, when the target sub block is included in the second group or the third group.

6. The memory device of claim 5,
wherein the erase controller controls the peripheral circuit to perform the erase operation based on the optimal parameter to which a basic weight is applied when the position of the target sub block is a reference position of the memory block.

7. The memory device of claim 6,
wherein the erase controller controls the peripheral circuit to perform the erase operation based on the optimal parameter to which a weight less than the basic weight is applied when the position of the target sub block is lower than the reference position.

8. The memory device of claim 6,
wherein the erase controller controls the peripheral circuit to perform the erase operation based on the optimal parameter to which a weight greater than the basic weight is applied when the position of the target sub block is higher than the reference position.

9. The memory device of claim 5,
wherein the erase controller controls the peripheral circuit to perform the erase operation based on the optimal parameter to which a basic weight is applied when a diameter of a channel where the target sub block is positioned is a reference size.

10. The memory device of claim 9,
wherein the erase controller controls the peripheral circuit to perform the erase operation based on the optimal parameter to which a weight less than the basic weight is applied when the diameter of the channel where the target sub block is positioned is less than the reference size.

11. The memory device of claim 9,
wherein the erase controller controls the peripheral circuit to perform the erase operation based on the optimal parameter to which a weight greater than the basic weight is applied when the diameter of the channel where the target sub block is positioned is greater than the reference size.

12. The memory device of claim 1,
wherein the optimal parameter includes at least one of an erase pulse count, an erase voltage level, a verify pulse count, and a verify voltage level applied in the erase operation.

13. The memory device of claim 2,
wherein the first reference number is two (2), and the second reference number is one (1).

14. A method of operating a memory device, the method comprising:
determining a group to which a target sub block on which an erase operation is to be performed belongs among a plurality of sub blocks included in a memory block;
wherein the group to which the target sub block belongs is determined based on a number of programmed sub blocks or a number of erased sub blocks included in the memory block;
performing the erase operation based on a default parameter or an optimal parameter according to a group to which the target sub block belongs among first, second, and third groups; and
setting the optimal parameter based on a result of the erase operation when the target sub block is included in the first group or the third group.

15. The method of claim 14, wherein determining the group to which a target sub block belongs comprises:

determining that the target sub block belongs to the first group when the memory block includes a first reference number or more of programmed sub blocks during the erase operation;
determining that the target sub block belongs to the second group when the memory block includes a second reference number or more of erased sub blocks; and
determining that the target sub block belongs to the third group when the memory block includes the first reference number or more of programmed sub blocks and the second reference number or more of erased sub blocks.

16. The method of claim 15, wherein performing the erase operation comprises:
performing the erase operation based on the default parameter when the target sub block is included in the first group; and
performing the erase operation based on the optimal parameter when the target sub block is included in the second group or the third group.

17. The method of claim 16,
wherein when the target sub block is included in the second group or the third group, the erase operation is performed based on the optimal parameter to which a weight according to a position of the target sub block in the memory block is applied.

18. The method of claim 17,
wherein the erase operation is performed based on the optimal parameter to which a weight different from a basic weight is applied according to a comparison result between the position of the target sub block and a reference position of the memory block.

19. The method of claim 17,
wherein the erase operation is performed based on the optimal parameter to which a weight different from a basic weight is applied according to a comparison result between a diameter of a channel where the target sub block is positioned and a reference size.

20. The method of claim 14,
wherein the optimal parameter includes at least one of an erase pulse count, an erase voltage level, a verify pulse count, and a verify voltage level applied in the erase operation.

* * * * *